US008446716B2

(12) United States Patent
Fan et al.

(10) Patent No.: US 8,446,716 B2
(45) Date of Patent: May 21, 2013

(54) FLAT PANEL DISPLAY AND ITS COMBINATIVE OUTER FRAME

(75) Inventors: Chih-Shun Fan, Hsin-Chu (TW); Ting-Fang Lo, Hsin-Chu (TW)

(73) Assignee: AU Optronics Corporation, Hsin-Chu (TW)

( * ) Notice: Subject to any disclaimer, the term of this patent is extended or adjusted under 35 U.S.C. 154(b) by 840 days.

(21) Appl. No.: 12/628,292

(22) Filed: Dec. 1, 2009

(65) Prior Publication Data

US 2010/0177031 A1 Jul. 15, 2010

(30) Foreign Application Priority Data

Jan. 9, 2009 (TW) ................................ 98100791 A

(51) Int. Cl.
*H05K 5/00* (2006.01)
*H05K 7/00* (2006.01)
*G06F 1/16* (2006.01)
*G02F 1/1333* (2006.01)

(52) U.S. Cl.
USPC ............. 361/679.21; 349/56; 349/58; 349/60

(58) Field of Classification Search
USPC ............. 361/679.21, 679.22, 679.26; 349/56, 349/58, 60
See application file for complete search history.

(56) References Cited

U.S. PATENT DOCUMENTS

| 5,175,873 | A | * | 12/1992 | Goldenberg et al. | ......... | 455/351 |
| 8,081,269 | B2 | * | 12/2011 | Yada et al. | ....................... | 349/60 |
| 2007/0132906 | A1 | * | 6/2007 | Shen et al. | ....................... | 349/58 |
| 2008/0030989 | A1 | | 2/2008 | Yang et al. | | |

FOREIGN PATENT DOCUMENTS

| CN | 1979277 | 6/2007 |
| JP | 2004361654 | 12/2004 |

OTHER PUBLICATIONS

Taiwan Office Action dated Jul. 27, 2012.
Chinese language office action dated Nov. 13, 2009.
English language translation of abstract and pertinent parts of CN 1979277 (published Jun. 13, 2007).
English language translation of abstract of JP 2004361654 (published Dec. 24, 2004).

* cited by examiner

*Primary Examiner* — Anthony Haughton
(74) *Attorney, Agent, or Firm* — McClure, Qualey & Rodack, LLP

(57) ABSTRACT

A combinative outer frame for a flat panel display (FPD) and a FPD and a manufacturing method of the FPD are provided. The outer frame for the FPD includes a front frame, a support frame, and an elastic pad. The support frame is disposed opposite to the front frame and includes a ridge which protrudes upon it; two sides of the elastic pad are joined to the front frame and the support frame respectively so that the ridge is pressed into it. This design causes tighter joining between different components of a frame, so as to prevent dust from invading FPD modules.

17 Claims, 7 Drawing Sheets

FLAT PANEL DISPLAY AND ITS COMBINATIVE OUTER FRAME

This application claims priority based on a Taiwanese Patent Application No. 098100791, filed on Jan. 9, 2009, the disclosure of which is incorporated herein by reference in its entirety.

BACKGROUND OF THE INVENTION

1. Field of the Invention

The present invention relates to a flat panel display (FPD); particularly, the present invention relates to the design of a combinative outer frame for a FPD.

2. Description of the Related Art

Restricted by the electron beam gun in the conventional cathode ray tube (CRT) display, the volume of the CRT displays is hard to be minimized. Therefore, the disadvantages of CRT display become more and more obvious as the development tendency of nowadays electronic products focuses on the features of light weight, thin thickness, short length, and small volume. Besides, the radiations of the CRT display during operation are harmful to human's eyesight. As a result, flat panel displays (FPD) which are developed with the help of semi-conductor technology and optoelectronic technology, such as liquid crystal displays (LCD), have gradually become the mainstream monitor products.

According to the conventional design of liquid crystal display module (LCM), double-sided tapes are employed to combine plastic components and metal components of the frame.

SUMMARY OF THE INVENTION

It is an objective of the present invention to provide a combinative outer frame for FPD which can overcome the above problems in the prior art. The present invention enhances the join between different portions of a frame body, so as to achieve the purpose of preventing dust from invading FPD modules.

It is another objective of the present invention to provide a FPD and a manufacturing method thereof. A design which prevents dust from invading the FPD module is adopted to join the outer frame components of FPD, so as to improve the production yield.

The combinative outer frame of the present invention includes a front frame, a support frame, and an elastic pad. The front frame includes an inner surface; the support frame is disposed opposite to the front frame and includes a sidewall. The sidewall includes a top surface. The top surface is opposite to the inner surface of the front frame and includes a ridge which protrudes thereupon. Two sides of the elastic pad join the front frame and the support frame, respectively, so that the ridge on the support frame presses into the elastic pad and consequently interferes with the elastic pad to tightly join the front frame and the support frame so as to prevent dust from invading the FPD module.

The FPD of the present invention includes a front frame, a display panel, and a backlight module. The front frame includes an inner surface. The display panel is disposed corresponding to the inner side of the front frame. The backlight module including a support frame and an elastic pad is disposed opposite to the front frame with respect to the display panel so that the display panel is sandwiched between the backlight module and the front frame. The support frame includes a sidewall which has a top surface thereon. The top surface is opposite to the inner surface of the front frame and includes a ridge which protrudes therefrom. Two sides of the elastic pad join the front frame and the support frame respectively so that the ridge on the support frame presses into the elastic pad and consequently interferes with the elastic pad to tightly join the front frame and the support frame so as to prevent dust from invading the FPD module.

The manufacturing method for the FPD display of the present invention includes the following steps: providing a support frame including a sidewall which has a top surface thereon; forming at least a ridge upon the top surface so that the ridge protrudes out from the top surface and is distributed along the extending direction of the sidewall; disposing the support frame, so that the top surface is opposite to an inner surface of a front frame; sandwiching a display panel between the support frame and the front frame; disposing an elastic pad between the inner surface and the top surface; combining the front frame and the support frame, so that the elastic pad joins the inner surface, the display panel, and the top surface, and the ridge is pressed into the elastic pad.

DETAILED DESCRIPTION OF THE PREFERRED EMBODIMENT

The present invention provides a combinative outer frame for FPD modules, a FPD employing the combinative outer frame, and a manufacturing method of the FPD. In a preferred embodiment, the combinative outer frame of the present invention is applied to various FPDs such as LCD, Plasma Display Panel (PDP), Field Emission Display (FED), Organic Light Emitting Display (OLED), etc.

Figure 1:
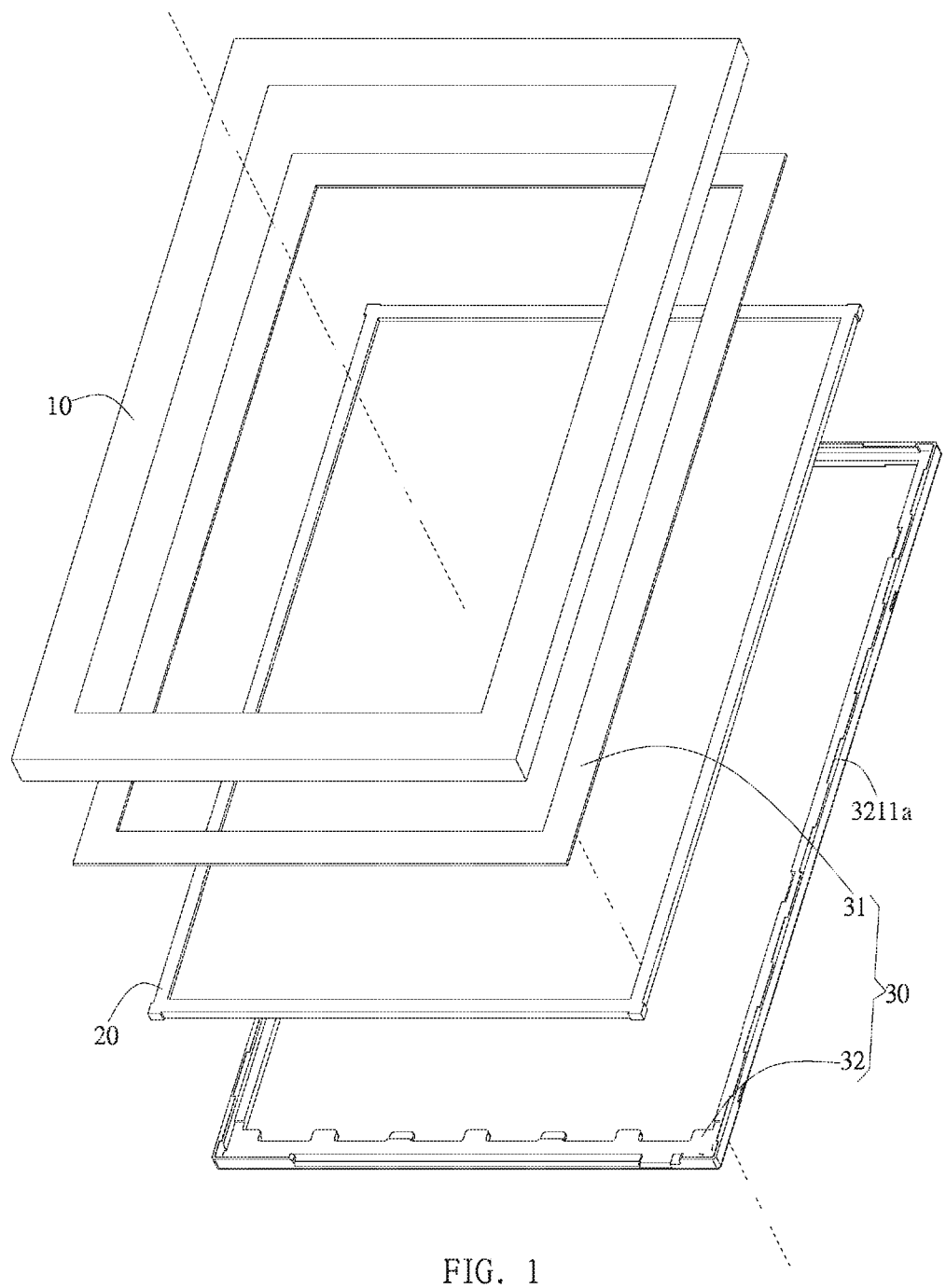
FIG. 1 is an exploded view of an embodiment of a flat panel display of the present invention.

FIG. 1 is an exploded view of an embodiment of a flat panel display of the present invention. As shown in FIG. 1, the FPD includes a front frame 10, a display panel 20, and a backlight module 30. The front frame 10 includes an inner surface 11 (see FIG. 2) which faces inward. The front frame 10 is preferably a frame having an opening formed at its central portion, and the display panel 20 is exposed through the opening. The display panel 20 is disposed on the inner side of the front frame 10 and displays images through the opening. The backlight module 30 includes an elastic pad 31 and a support frame 32. The display panel 20 connects to the inner surface 11 through the elastic pad 31. The support frame 32 encompasses the display panel 20 and connects to the inner surface 11 of the front frame 10 through the elastic pad 31 so that the support frame 32 faces the inner side of the front frame 10. As a result, the display panel 20 and the backlight module 30 are both encompassed by the front frame 10. The support frame 32 includes a ridge 3211a. The ridge 3211a is formed on a top surface of a sidewall of the support frame 32 by an injection molding process. The support frame 32 faces the front frame 10 and connects to the inner surface 11 through the elastic pad 31.

Figure 2:
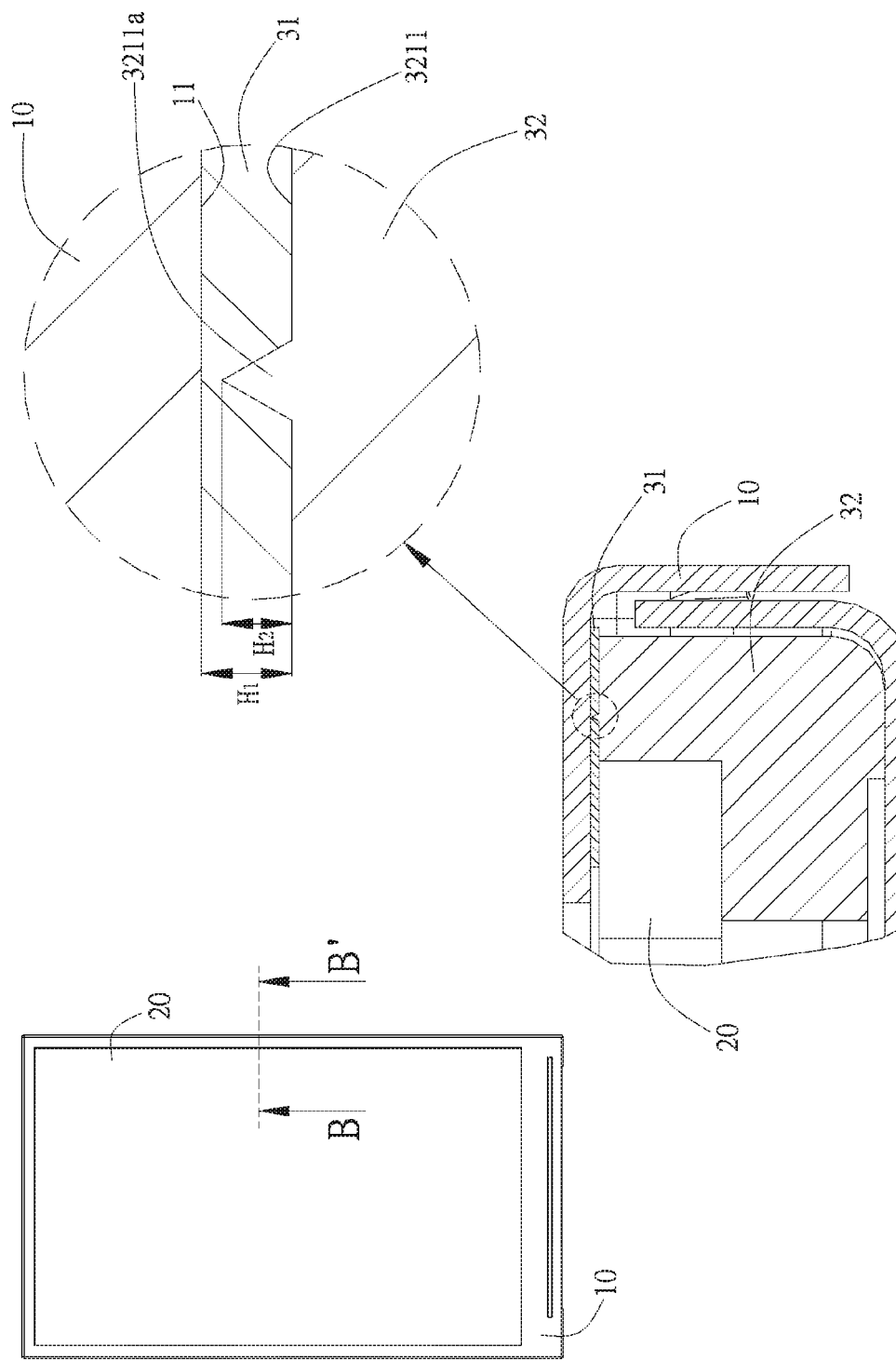
FIG. 2 is a cross-sectional view of the embodiment of the FPD shown in FIG. 1.

FIG. 2 is a cross-sectional view of the embodiment of the FPD shown in FIG. 1. As shown in FIG. 2, the FPD is composed of the front frame 10, the display panel 20, the elastic pad 31, and the support frame 32. The elastic pad 31 is sandwiched between the inner surface 11 of the front frame 10 and the top surface 3211 of the support frame 32. The display panel 20 is surrounded by the front frame 10, the elastic pad 31, and the support frame 32. The elastic pad 31 is disposed between the display panel 20 and the front frame 10. The display panel 20 is encompassed by the support frame 32. In this embodiment, the front frame 10 is made of metal while the support frame 32 is made of plastic. However, in other embodiments, other materials can be used.

Figure 3A:
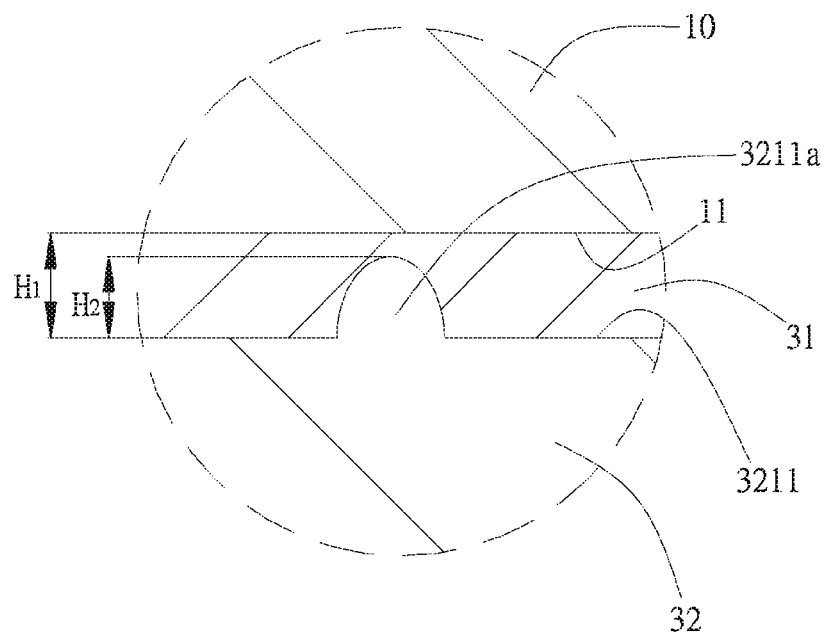
FIG. 3A is a cross-sectional view of an embodiment of the ridge of the outer frame of the FPD of the present invention.
Figure 3B:
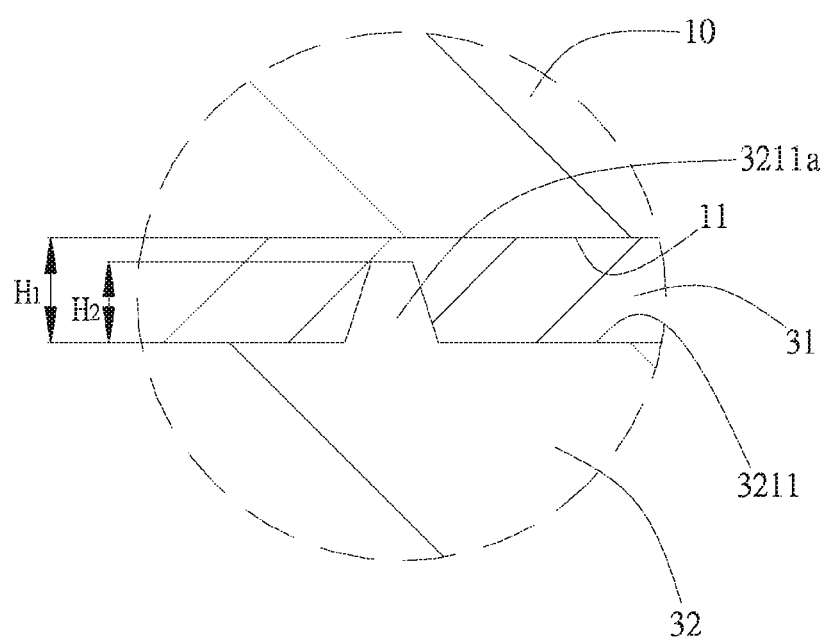
FIG. 3B is a cross-sectional view of another embodiment of the ridge of the outer frame of the FPD of the present invention.

The elastic pad 31 preferably has two opposite surfaces. One of the surfaces contacts the inner surface 11 while the other contacts the top surface 3211, so that the ridge 3211a is pressed into the elastic pad 31. As shown in FIG. 2, the elastic pad 31 has a pad thickness $H_1$, and the ridge 3211a has a ridge height $H_2$. The pad thickness $H_1$ is not smaller than the ridge height $H_2$, so that the ridge 3211a can interfere with the elastic pad 31. As a result, the front frame 10 and the support frame 32 are tightly joined to each other through the elastic pad 31, so as to prevent dust from invading the FPD module. The elastic pad 31 is made of elastic material. In a preferred embodiment, a sticky elastic material is used. In this embodiment, a double-sided tape is employed as the elastic pad 31. However, in other embodiments, a single-sided adhesive tape, a elastic non-sticky rubber pad, or other materials can be employed. The ridge 3211a preferably has a cross-section with a narrower top and a wider bottom, so that the ridge 3211a can be easily pressed into the plastic pad 31. As shown in FIG. 2, in this embodiment, the ridge 3211a having a triangle cross-section protrudes out from the top surface 3211. In other embodiments, the ridge 3211a can be formed to have a cross-section of other shapes such as a semi-circular shape shown in FIG. 3A or a trapezoid shown in FIG. 3B.

Figure 4:
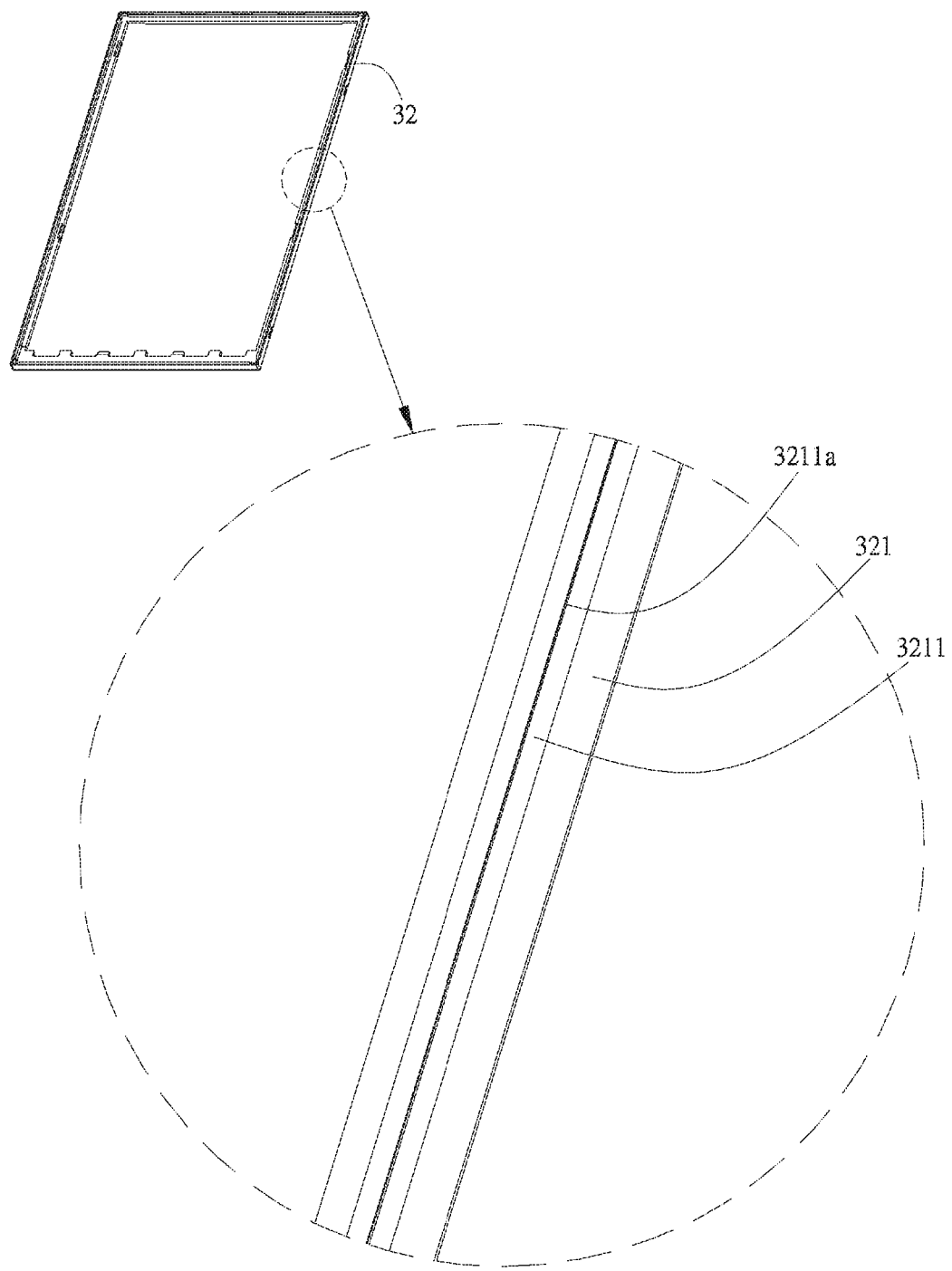
FIG. 4 is a schematic view of an embodiment of the support frame of the outer frame of the FPD of the present invention.
Figure 5:
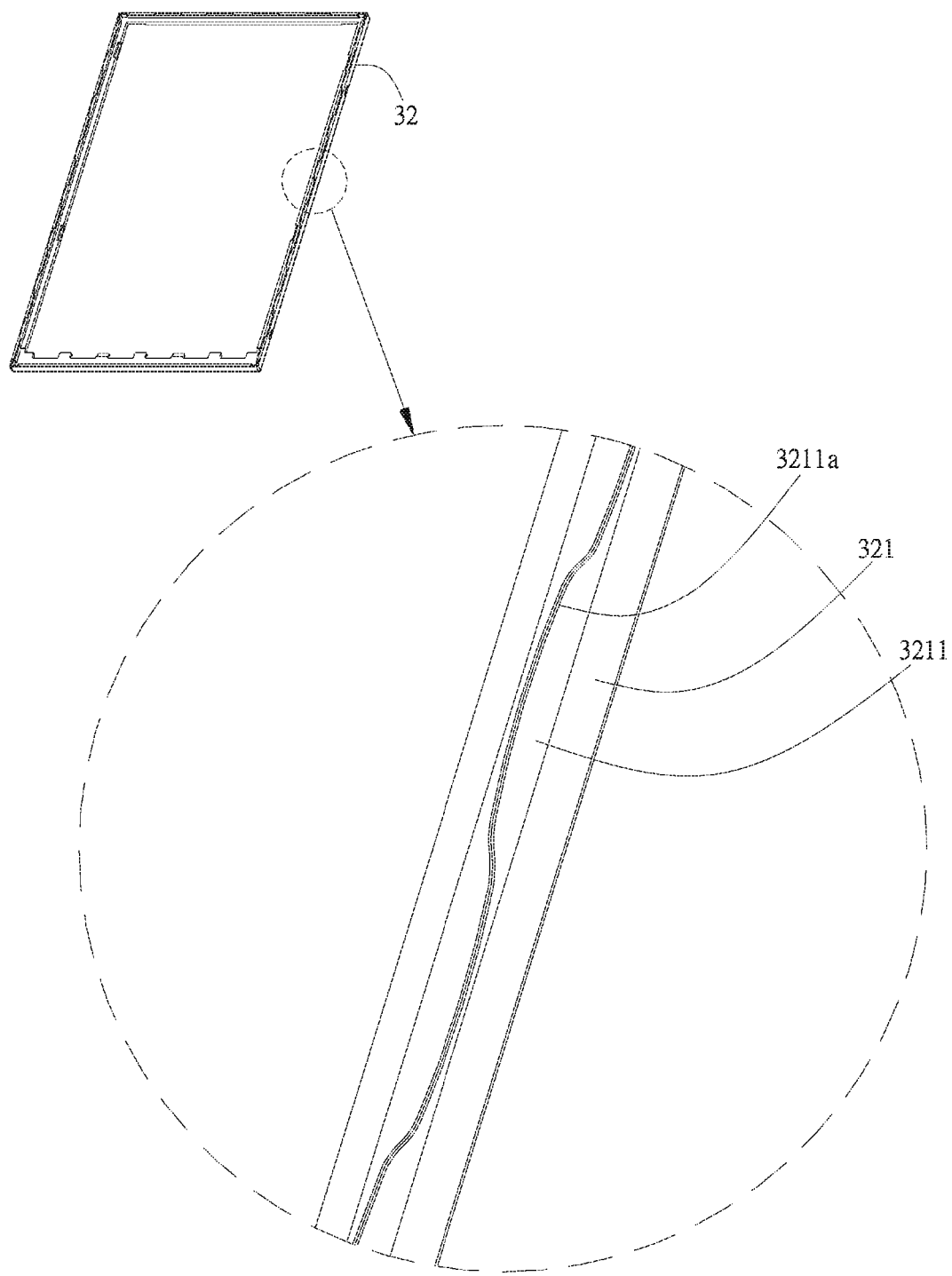
FIG. 5 is a schematic view of another embodiment of the support frame of the outer frame of the FPD of the present invention.

FIG. 4 is a schematic view of an embodiment of the support frame of the outer frame of the FPD of the present invention. As shown in FIG. 4, the support frame 32 includes a sidewall 321 which has a top surface 3211 thereupon. A ridge 3211a is formed on the top surface 3211. In this embodiment, the ridge 3211a is distributed on the top surface 3211 in a straight line along the sidewall 321. However, in other embodiments, as shown in FIG. 5, the ridge 3211a can be distributed in a curve line along the sidewall 321. Moreover, the ridge 3211a can be distributed in other zigzag forms.

Figure 6:
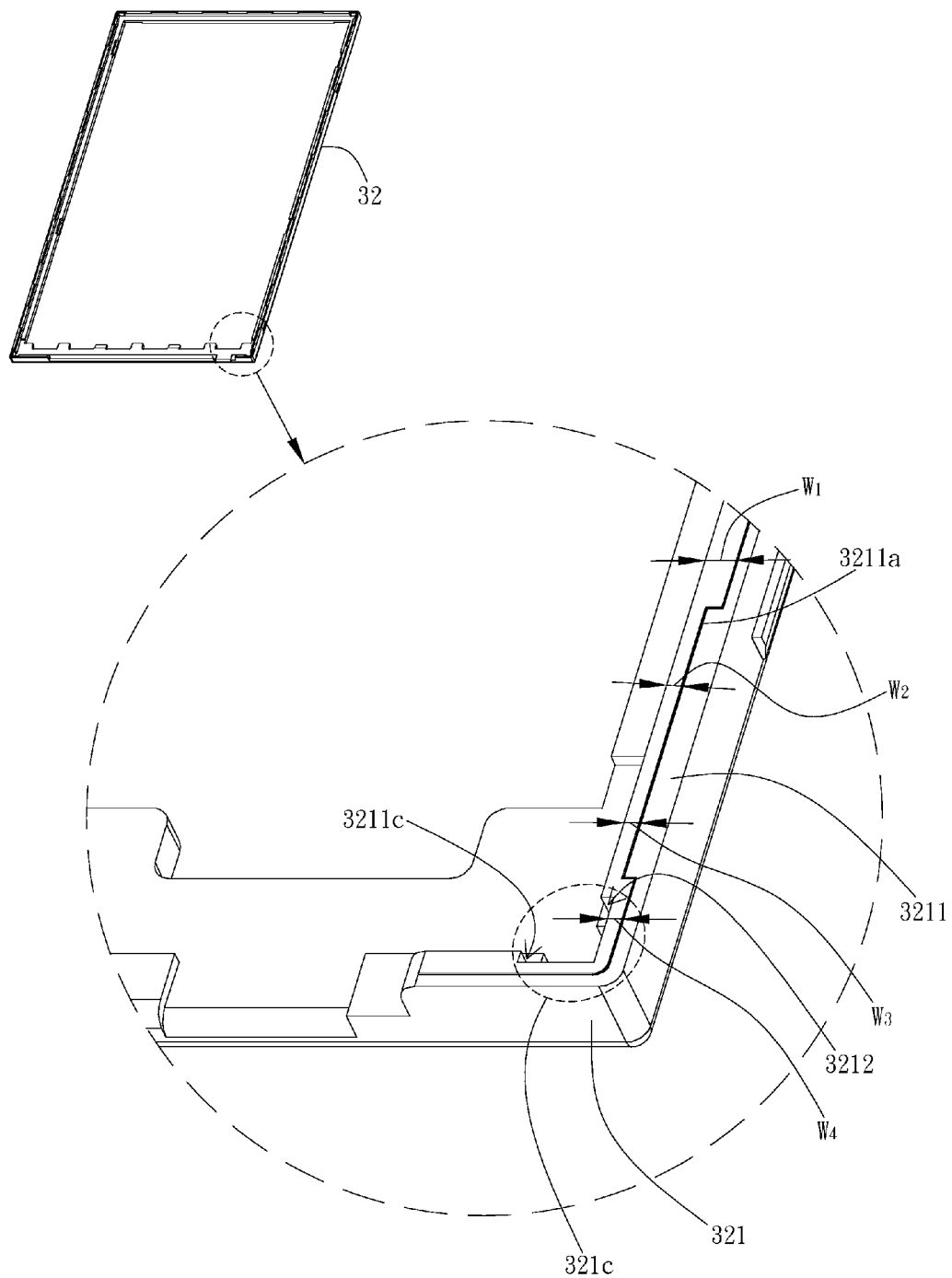
FIG. 6 is a schematic view of the support frame of the outer frame of the FPD of the present invention shown in FIG. 2.

FIG. 6 is a schematic view of the support frame of the outer frame of the FPD of the present invention shown in FIG. 2. As shown in FIG. 6, in the preferred embodiment, the ridge 3211a is distributed on the top surface 3211 zigzagly along the sidewall 321, so that the ridge 3211a keeps different distances from the edge of the top surface 3211a such as $W_1$ and $W_2$. Because the volume of the ridge 3211a is relatively small compared to that of the sidewall 321, the ridge 3211a extends upon the top surface 3211 as a microstrip. In this embodiment, the ridge 3211a is disposed non-continuously. For instance, there is no ridge 3211a disposed on the notch of the sidewall 321 on the bottom left of FIG. 6. However, in other embodiments, the ridge 3211a can be continuously distributed in a closed circle around the top surface 3211 to form a closed microstrip. That is to say, the ridge 3211a is a complete, continuous ring-shaped structure formed on the top surface 3211. Moreover, more than one ridge 3211a can be provided. In other words, a plurality of ridges 3211a can be formed on the top surface 3211.

Besides, the curve or the bend of the ridge 3211a can be adjusted according to the situation of the top surface 3211. As shown in FIG. 6, at the corner, a recess 321c is formed on the inner side of the sidewall 321 and the top surface 3211 is correspondingly reduced. That is, a pit 3211c is formed on the top surface 3211 at the corner. Hence, the ridge 3211a is bent along the edge of the pit 3211c to keep a certain distance from the edge of the top surface 3211, such as W3 and W4 which are equally distanced from the edge of the top surface 3211.

Figure 7:
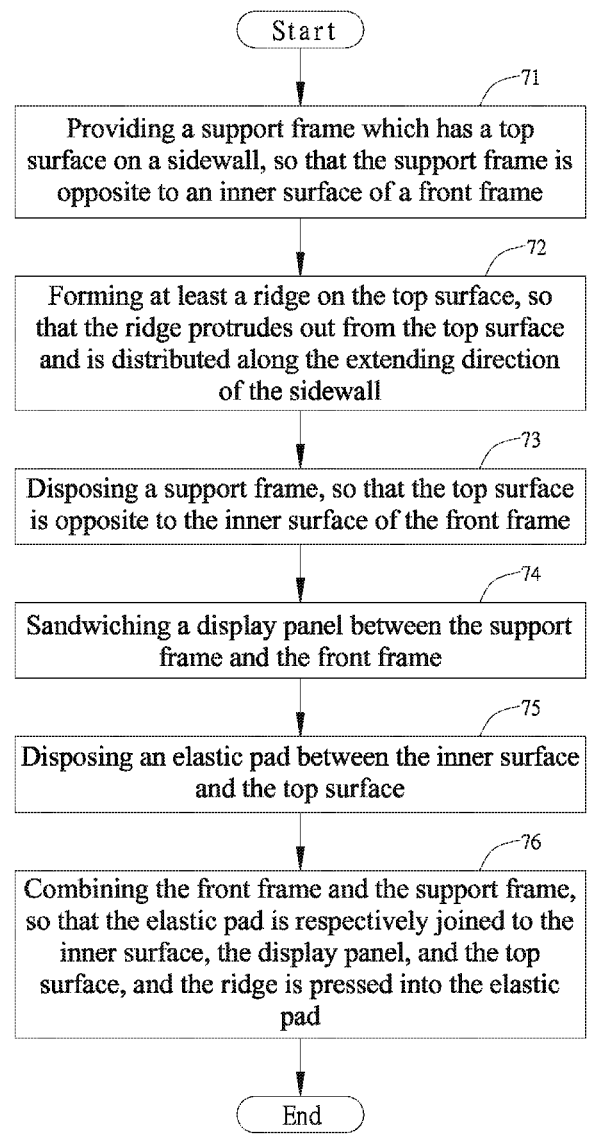
FIG. 7 is a flow chart of an exemplary method of manufacturing the FPD of the present invention.

FIG. 7 is a flow chart of an exemplary method of manufacturing the FPD of the present invention. As shown in FIG. 7, step 71 includes providing a support frame which has a top surface on a sidewall, so that the support frame is opposite to an inner surface of a front frame. In a preferred embodiment, the support frame is made of plastic by an injection molding process, while the front frame is made of metal by a casting process. Step 72 includes forming at least a ridge on the top surface, so that the ridge protrudes out from the top surface and is distributed along the extending direction of the sidewall. In a preferred embodiment, the ridge is formed by the injection molding process. Step 72 includes forming the ridge on the top surface in a curve (such as zigzag) line or a straight line. When a recess 321c is formed on the inner side of the sidewall at the corner to correspondingly form a pit 3211c on the top surface, step 72 further includes forming a ridge on the top surface along the edge of the pit 3211c to keep a certain distance from the edge of the pit 3211c. Step 73 includes disposing a support frame, so that the top surface is opposite to the inner surface of the front frame. Step 74 includes sandwiching a display panel between the support frame and the front frame. Step 75 includes disposing an elastic pad between the inner surface and the top surface. Step 76 includes combining the front frame and the support frame, so that the elastic pad is respectively joined to the inner surface, the display panel, and the top surface, and the ridge is pressed into the elastic pad. In a preferred embodiment, the elastic pad has two sticky surfaces on two opposite sides, respectively. Step 76 further includes adhering one side of the elastic pad to the top surface and the display panel, and adhering the other side of the elastic pad to the inner surface.

Although the present invention has been described through the above-mentioned related embodiments, the above-mentioned embodiments are merely the examples for practicing the present invention. What need to be indicated is that the disclosed embodiments are not intended to limit the scope of the present invention. On the contrary, the modifications within the essence and the scope of the claims and their equivalent dispositions are all contained in the scope of the present invention.

What is claimed is:

1. A combinative outer frame for a flat panel display, comprising:
    a front frame including an inner surface;
    a support frame including a sidewall, said sidewall including a top surface, wherein said top surface including a ridge protruding therefrom is distributed along an extending direction of said sidewall in a zigzag-like manner and is opposite to said inner surface of the front frame; and
    an elastic pad joined to said inner surface and said top surface respectively, so that said ridge is pressed into said elastic pad, wherein said elastic pad has a pad thickness, said ridge has a ridge height, and said pad thickness is larger than or equal to said ridge height.

2. The combinative outer frame of claim 1, wherein at least one recess is formed on an inner side of said sidewall to form at least one pit upon said top surface, and said ridge is bent along the edge of said pit.

3. The combinative outer frame of claim 1, wherein said ridge is discontinuously disposed on said top surface.

4. The combinative outer frame of claim 1, wherein said ridge is distributed in a closed circle around said top surface.

5. The combinative outer frame of claim 1, wherein at least one of two opposite surfaces of said elastic pad is sticky and adhered to said inner surface and said top surface respectively.

6. The combinative outer frame of claim 1, wherein said ridge has a cross-section with a narrower top and a wider bottom on said top surface.

7. A flat panel display, comprising:
a front frame including an inner surface;
a display panel disposed corresponding to an inner side of the front frame; and
a backlight module disposed opposite to said front frame so that the display panel is sandwiched between said backlight module and said front frame, said backlight module including:
 a support frame including a sidewall, said sidewall including a top surface, wherein said top surface is opposite to said inner surface of said front frame and includes at least a ridge protrudes therefrom, said ridge is distributed along an extending direction of said sidewall in a zigzag-like manner; and
 an elastic pad joined to said inner surface, said display panel, and said top surface respectively, so that said ridge is pressed into said elastic pad, wherein said elastic pad has an pad thickness, said ridge has a ridge height, and said pad thickness is larger than or equal to said ridge height.

8. The flat panel display of claim 7, wherein at least one recess is formed on an inner side of said sidewall to form at least one pit upon said top surface, and said ridge is bent along the edge of said pit.

9. The flat panel display of claim 7, wherein said ridge is discontinuously disposed on said top surface.

10. The flat panel display of claim 7, wherein said ridge is distributed in a closed circle around said top surface.

11. The flat panel display of claim 7, wherein at least one of two opposite surfaces of said elastic pad is sticky and adhered to said inner surface and said top surface respectively.

12. The flat panel display of claim 7, wherein said ridge has a cross-section with a narrower top and a wider bottom on said top surface.

13. A method for manufacturing a flat panel display, comprising:
providing a support frame, wherein said support frame includes a sidewall, said sidewall includes a top surface;
forming at least a ridge upon said top surface so that the ridge protrudes from the top surface and is distributed along an extending direction of said sidewall;
disposing the support frame, so that the top surface is opposite to an inner surface of a front frame;
sandwiching a display panel between said support frame and said front frame;
disposing an elastic pad between said inner surface and said top surface; and
combining said front frame and said support frame, so that the elastic pad respectively joins the inner surface, the display panel, and the top surface, and said ridge is pressed into said elastic pad; wherein the step of forming said ridge comprising forming said ridge in a zigzag-like manner on said top surface.

14. The method of claim 13, wherein the step of forming said ridge comprising distributing said ridge in a closed circle around said top surface.

15. The method of claim 13, wherein the step of forming said ridge comprising forming said ridge in a discontinuous manner on said top surface.

16. The method of claim 13, wherein at least one recess is formed on an inner side of said sidewall to form at least one pit upon said top surface, and the step of forming said ridge further comprising forming said ridge upon said top surface so that said ridge is bent along the edge of said pit.

17. The method of claim 13, wherein the step of disposing said elastic pad comprising:
making at least one of two opposite surfaces of said elastic pad to be sticky; and
adhering said two opposite surfaces of said elastic pad to said inner surface and said top surface respectively.

* * * * *